United States Patent [19]

Grosclaude et al.

[11] Patent Number: 5,225,315

[45] Date of Patent: Jul. 6, 1993

[54] WATER SOLUBLE FORMULATION FOR MASKING AND THE LIKE, AND METHOD UTILIZING THE SAME

[75] Inventors: Gary V. Grosclaude, Winsted; Andrew G. Bachmann, Harwinton, both of Conn.

[73] Assignee: Dymax Corporation, Torrington, Conn.

[21] Appl. No.: 762,416

[22] Filed: Sep. 19, 1991

[51] Int. Cl.$^5$ ............................ C08J 9/08; C08J 3/28; C08K 3/26; B05D 3/06
[52] U.S. Cl. .................................... 430/270; 430/281; 430/283; 522/83; 522/151; 522/152; 521/92; 521/123; 427/510; 427/508; 427/519; 427/520; 427/96; 427/97
[58] Field of Search ...................... 430/281, 283, 270; 522/83, 151, 152; 521/92, 123; 427/96, 97, 510, 519, 520, 508

[56] References Cited

U.S. PATENT DOCUMENTS

| | | | |
|---|---|---|---|
| 3,888,804 | 6/1975 | Swanholm et al. | 522/46 |
| 4,080,351 | 3/1978 | Zalzal | 524/421 |
| 4,124,389 | 11/1978 | Hoornstra et al. | 522/14 |
| 4,215,025 | 7/1980 | Packer et al. | 260/29.2 R |
| 4,514,271 | 4/1985 | Williams et al. | 525/283 |
| 4,613,628 | 9/1986 | Hoshino et al. | 521/92 |
| 4,689,352 | 8/1987 | Titti et al. | 521/88 |
| 5,047,440 | 9/1991 | Wilson, Jr. | 521/88 |
| 5,049,480 | 9/1991 | Nebe et al. | 430/281 |
| 5,100,763 | 3/1992 | Kimoto et al. | 430/281 |

Primary Examiner—Marion E. McCamish
Assistant Examiner—Susan Berman
Attorney, Agent, or Firm—Ira S. Dorman

[57] ABSTRACT

A water-soluble coating or other deposit is produced from a formulation that is comprised of a curable liquid substance and a dispersed particulate effervescing agent. The formulation is particularly useful as a solder resist in the manufacture of PCBs, and the preferred composition contains n-vinyl-2-pyrrolidone, N,N-dimethylacrylamide, and polyvinylpyrrolidone.

33 Claims, No Drawings

WATER SOLUBLE FORMULATION FOR MASKING AND THE LIKE, AND METHOD UTILIZING THE SAME

BACKGROUND OF THE INVENTION

Resinous coatings are commonly used to provide physical and chemical barrier protection for a wide variety of surfaces, structures, articles and the like, both during the course of production and also subsequent thereto. The extensive manufacture of printed circuit boards (PCBs) and other such electrical and electronic devices has given rise to a particularly important application for such coatings, that being in the provision of solder resists, or maskants. It is well known in the art that such resist coatings may be of either a permanent or temporary nature, removable in the latter instance by aggressive hot water washing or by use of a chemical solvent; it is also well known that the coatings may be produced from formulations that solidify or cure through a variety of mechanisms, including air-drying, thermal activation and/or photopolymerization.

The properties that a satisfactory coating formulation of this nature must exhibit will vary from case to case, but in general the following will be deemed desirable, if not essential, characteristics: fast cure, good adhesion, good resistance to deterioration under prevailing chemical and thermal conditions, satisfactory shelf-life, homogeneity, and rheological properties (e.g., smooth flow, with maintenance of shape as applied), low volatility, unobjectionable odor, non-toxicity, non-allergenicity, and non-flammability. When the coating is to be a temporary one, moreover, speed, thoroughness, and facility of removal will usually be of primary concern.

Needless to say, in those instances in which the formulation is intended specifically for use as a solder resist, the cured coating must be able to withstand the heat of the molten solder (typically applied as a wave) for at least a minimal period of time (e.g., 315° Centigrade, for 15 seconds). It should in addition be resistant to solder flux and other chemicals, and should not be wetted by the solder.

Water-soluble adhesive coatings for mounting components to printed wiring boards have been provided in the past; for example Packer et al U.S. Pat. No. 4,215,025, issued Jul. 29, 1980, discloses a composition consisting of a water-soluble alcohol, water, a wetting agent, and a water-soluble, keto-group containing acid of specified structure. As far as is known, however, no formulation described in the art or heretofore available adequately satisfies the foregoing and other criteria for a solder resist, or for a similar material that is suitable for use in producing a water-soluble coating or other deposit.

Accordingly, it is the broad object of the present invention to provide a novel formulation and method for producing a water-soluble deposit upon a substrate.

More specific objects are to provide such a formulation and method from and in which the deposit produced can be readily, thoroughly and rapidly removed, using mild washing conditions and, if so desired, commercially available equipment.

Additional objects are to provide such a formulation which affords fast and complete cure, good adhesion to the underlying surface, and excellent resistance to deterioration in the chemical and thermal environment in which conventional soldering operations are carried out, while at the same time being readily applied to a substrate providing favorable economics, and at least adequately satisfying other of the criteria enumerated herein.

A further object of the invention is to provide a method having the foregoing features and advantages which, in addition, may be particularly adapted for the production of a soldered article, especially a PCB.

SUMMARY OF THE INVENTION

It has now been found that certain of the foregoing and related objects of the invention are attained by the provision of a formulation for producing a water-soluble deposit upon a substrate, comprising a nonaqueous liquid substance that is curable to a solid, adherent, water-soluble matrix, and a water-soluble filler dispersed therein. In a preferred formulation the filler will comprise a particulate agent that effervesces upon admixture with water, and such a formulation will usually function best if it contains at least four percent of the effervescing agent, based upon the weight thereof; the concentration will usually not exceed about 70 weight percent, albeit that formulations containing as much as 95 weight percent of fillers would be desirable from economical standpoints and are believed to be feasible, provided that the matrix resins afford sufficient integrity in the dry state.

In most instances, the effervescing agent used will be a mixture of a solid acid compound and a solid base compound, present in an acid:base weight ratio in the range 1:4 to 4:1, and preferably 2:1, and at least one of the components (and preferably both) will be insoluble in the matrix-forming substance. Although inorganic acids may be employed, organic compounds such as citric ascorbic and p-toluenesulfonic acids will usually be preferred; the preferred base compound (largely for reasons of safety and economy) will be a carbonate or bicarbonate, especially the sodium, potassium and ammonium carbonate and bicarbonate salts.

The curable liquid substance employed in the formulation will normally comprise a polymerizable monomer composition, the monomeric portion of which will advantageously consist predominantly (or entirely) of at least one vinyl compound, preferably a cyclic vinyl amide and most desirably n-vinyl-2-pyrrolidone (NVP). In especially preferred embodiments the monomer composition will comprise a mixture of such a cyclic amide with a copolymerizable aliphatic acrylamide and N,N-dimethylacrylamide is regarded to be particularly desirable as a coreactant with NVP. The most preferred formulations will additionally include a polymeric water-soluble filler; polyvinylpyrrolidone (FVP) will usually be found especially beneficial for that purpose.

Generally, the monomer composition will contain an initiator in an amount that is effective for initiating polymerization of the monomers present; an actinic radiation-responsive photoinitiator, typically a UV catalyst, will preferably be employed. The formulation will desirably include a drying agent or desiccant distributed throughout the liquid substance, and it may contain other ingredients as well, such as viscosity control agents, thixotropic agents, colorants, and the like.

Additional objects of the invention are attained by the provision of a photoinitiated coating formulation comprised of an aliphatic acrylate monomer, a cyclic vinylamide monomer, and a water-soluble resin (polymeric filler); and still other objects are attained by the provision of a method for producing an article using the instant formulations. In preferred embodiments of the method the deposit Will be of such a nature a to permit dissolution to be carried out with water at a temperature in the range 20° to 80° Centigrade, and when the liquid substance contains a photoinitiator curing will of course be implemented by exposure of the surface to actinic radiation of appropriate wavelength.

In those instances in Which the formulation is composed to function as a solder resist, the method is carried out by applying it to a first portion of the surface of a substrate while leaving a second surface portion free thereof. After effecting curing of the formulation, molten solder is applied and allowed to harden, and the surface is finally washed with water to remove the deposit. The substrate used to produce a PCB will of course be a suitable board, on which hardened solder will define an electrically conductive path; such a method Will commonly include the additional step of assembling at least one electrical component on the board, in which case the curing step may be relied upon to temporarily secure the component in position prior to permanent affixation, by soldering.

DETAILED DESCRIPTION OF THE PREFERRED EMBODIMENTS

Exemplary of the efficacy of the present invention are the following Examples, wherein all parts and percentages specified are on a weight basis:

EXAMPLE ONE

Part A

The following ingredients are combined and thoroughly mixed to Provide a solid, particulate effervescing agent: 10 parts of citric acid, 20 parts of sodium bicarbonate, and 5 parts of anhydrous sodium sulfate (as a desiccant). A polymerizable monomer composition is prepared from 15.5 parts of a 10% solution of polyvinylpyrrolidone (having a nominal molecular weight of 90,000) in n-vinyl-2-pyrrolidone, 14 parts of N,N-dimethylacrylamide, and 0.5 part of 2 hydroxy-2-methyl-1-phenyl propan-1-one, a UV-responsive photoinitiator.

Equal amounts of the effervescing agent and the monomer composition are admixed and well stirred to disperse the solid ingredients in the liquid (the solid ingredients being insoluble therein), and the formulation is loaded into a 30 cc syringe fitted with a needle having an inside diameter of 0.020 inch. A quantity of the formulation is applied from the syringe to a fiberglass-reinforced resin printed circuit board substrate having holes formed therein, flowing smoothly from the syringe and being so deposited as to enter and cover the holes, as well as a portion of the surface. After subjecting the deposit to UV irradiation at 20 milliwatts/cm for 10 seconds, to effect polymerization, the material is found to have cured to a tack-free condition, with the deposit exhibiting good adhesion to the board.

The resultant article is immersed in a container of still water at room temperature, producing a copious evolution of carbon dioxide gas. It is found that the temporary maskant deposit is removed completely within ten minutes, thoroughly cleaning not only the surface of the board but also the holes present therein.

Part B

The foregoing procedure is carried out substantially without modification, using however a formulation from which the effervescing agent is omitted. Although performing equally as well in other respects, it is observed that mere immersion of the board in water is far less effective in removing the deposit, especially from its holes, and that complete removal can be effected only by use of a strong flow of warm water, over a protracted period of time (on the order of at least an hour).

EXAMPLE TWO

To 15.5 parts of a 10% solution of PVP (90,000 molecular weight) in n-vinyl-2-pyrrolidone is added, with stirring, 14.0 parts of N,N-dimethylacrylamide, 0.5 part of the photoinitiator used in Example One, 3.0 parts of citric acid, 8.3 parts of sodium bicarbonate and 1.3 parts of sodium sulfate (anhydrous), producing a paste displaying good rheology. A portion of the mixture is placed into a 10 cc syringe fitted with a 0.020 inch I.D. needle.

Filaments of the maskant are deposited upon the surface of a PCB substrate, and exposed to UV irradiation at 25 milliwatts/cm$^2$; the formulation cures in 10 seconds to a tack-free surface. The board is thereafter processed in a conventional wave-soldering apparatus, producing a solder deposit on the maskant-free areas. It is then subjected to aqueous cleaning using equipment provided commercially for that purpose in PCB manufacture. and the temporary maskant is found to have been removed completely in a single pass.

EXAMPLE THREE

Part A

To a mixture consisting of 39 parts of n-vinyl-2-pyrrolidone, 39 parts of N,N-dimethylacrylamide, 13 parts of PVP (30,000 molecular weight), and 2.0 parts of 2-hydroxy-2-methyl-1-phenylpropan-1-one, is added 7.0 silica under high speed mixing; an effervescing agent, consisting of 33 parts of citric acid and 67 parts of sodium bicarbonate, is thereafter dispersed in the resultant thixotropic mass. A portion of the resultant formulation, which is of paste-like character, is shaped into ribbons and cured on the surface of a glass slide by exposure for 10 seconds to a UV radiation source rated at 20 milliwatts/cm$^2$. A tack-free coating is produced, which dissolves fully within five minutes when immersed in still, warm water at a temperature of 32° Centigrade.

Part B

Incorporation of sodium sulfate into the above formulation (three parts per hundred) so modifies rheology as to enable it to be dispensed through a 0.020 inch diameter needle, to form dots and filaments on the substrate. Cured under UV radiation for 10 seconds, the formulation produces an excellent dry coating that dissolves in four minutes in warm water.

EXAMPLES FOUR—SEVEN

In each of these Examples, a polymerizable monomer composition is prepared from the ingredients listed, admixed with one another in the proportions indicated; in all instances 1-hydroxycyclohexylphenyl ketone is employed as a UV photoinitiator:

EXAMPLE FOUR

NVP—1.0 part
Dimethylaminoethylmethacrylate, methane sulfonic acid salt—1.0 part Dimethylaminopropylacrylamide—0.65 part
Photoinitiator—0.02 part

EXAMPLE FIVE

Dimethylaminopropylacrylamide—1.0 part
Acrylic Acid—1.0 part
Photoinitiator—0.02 part

EXAMPLE SIX

Dimethylacrylamide—1.0 part
Methacrylamidopropyl trimethylammonium chloride—0.5 part
Photoinitiator—0.03 part

EXAMPLE SEVEN

Hydroxyethylmethacrylate—1.0 part
Methylacrylamidopropyl trimethylammonium chloride—0.5 part
Trimethylaminomethylmethacrylate—0.05 part
Photoinitiator—0.03 part Each composition is applied to a substrate, subjected to UV irradiation to effect curing, and then washed with water at room temperature. Although all of the resultant deposits dissolve at varying rates, none is found to be as readily soluble as the deposit produced in accordance with Example One, Part B; it should be noted however that, under certain circumstances (e.g., to satisfy waste-water treatment laws and regulations), incomplete dissoluition may be regarded to be beneficial. It might also be mentioned that the composition of Example Seven cures to a peelable gel, which may also be deemed a desirable form of the deposit for certain applications.

Admixing each of the compositions described in Examples Four through Seven with an equal part of the effervescing agent prepared in accordance With Example One, Part A, produces a formulation that is, after curing, more readily dissolved in water than is the deposit made from the corresponding, effervescing agent-free composition.

Although the n-vinyl-2-pyrrolidone/N,N-dimethylacrylamide copolymer hereinabove described is deemed to constitute the preferred matrix-forming resin, NVP alone, as well as other monomers that polymerize to produce water-soluble resins, may of course also be employed in the practice of the invention, alone and in combination with one another; the following are exemplary: hydroxyethyl(meth)acrylate, hydroxypropyl(meth)acrylate, methacrylamidopropyltrimethyl ammonium chloride, dimethylaminoalkyl(meth)acrylate and trimethylaminoalkyl(meth)acrylate, and quaternary salts (such as the methane sulfonic acid salts) thereof, N-methylolmethacrylamide, (meth)acrylamide, and derivatives thereof, such as dimethylaminopropylacrylamide, dimethylacrylamide, 2,4-pentadiene-1-ol, (meth)acrylic acid, itaconic acid, maleic acid, crotonic acid, sodium styrene sulfonate, 2-trimethylammonium ethylacrylate chloride, ammonium sulphaloethyl methacrylate, polyalkyleneglycol(meth)acrylates and di(meth)acrylates, glycerol(meth)acrylate, etc. The choice of suitable monomers, and specific combinations thereof, will be apparent to those skilled in the art. Generally, the polymerizable monomer will constitute 9 to 90 weight percent of the formulation, preferably not exceeding 70 percent.

While FVP (of molecular weight ranging from 15,000 to 90,000) is preferred as a Water-soluble polymeric filler, the composition of this ingredient may also vary widely, as exemplified by the following: polymers of acrylic and methacrylic acid, sodium carboxymethylcellulose, cellulose ethers such as hydroxyethylcellulose, hydroxypropylcellulose, methylcellulose and ethylcellulose, ethylene oxide, ethyleneimine, vinyl alcohol, methylvinylether/maleic anhydride copolymers, and starch and modified starch derivatives. Other suitable resins are disclosed in the literature, and the selection thereamong Will be evident to those skilled in the art; needless to say, any water-soluble resin produced from one or more of the monomers listed hereinabove will generally also be suitable for use as a polymeric filler in the instant formulations.

Insofar as the effervescing agent is concerned, acids suitable for use as an acid/base system include, in addition to those previously identified: caprylic, capric, lauric, palmitic, stearic, oleic, malonic, succinic, glutaric, adipic, maleic, alanine, arginine, and aspartic; inorganic acid salts, such as the ammonium and potassium phosphates, may also be used, and appropriate basic compounds have been identified hereinabove. It will be appreciated that other materials may be utilized as well, provided only that they are compatible with the matrix-forming ingredients and that they react with water to evolve a substantial volume of gas; for example, compounds such as methylisocyanate and phenylisocyanate may be employed as effervescing agents. Furthermore, it may be feasible to include in the formulation only one ingredient (e.g., a base compound) of a two-part system, and to include the other ingredient (e.g., an acid compound) in the wash water; in such a case, the base compound would constitute the effervescing "particulate agent" recited in the appended claims. It should be noted that some control upon the viscosity of the coating formulation can be achieved by variation of the particle size of this component; e.g., by reducing ingredients such as ammonium bicarbonate and citric acid to very finely divided form a substantial lowering of the viscosity can be realized. The effervescing agent functions of course by destroying the integrity, of the cured deposit, and by rendering it porous and hence more readily dissolved. Normally, the deposit will be removed completely in warm water (e.g., water at 20° to 80° Centigrade) in a period of 5 to 10 minutes, albeit that (as mentioned above) there may be instances in Which incomplete or less rapid dissolution is preferred. In any event, the wash water may be applied by any suitable means (including simple immersion of the workpiece), but commercial equipment (employing spraying or other aggressive washing techniques) can of course be used to good effect in carrying out the present method.

The formulation may, as also previously mentioned, include drying agents (e.g., sodium and magnesium sulfate, and calcium chloride), viscosity control and thixotropic agents (e.g., silica gel, amorphous silica, talc, clay), and fillers (in addition to the polymers mentioned above) that serve simply to increase water solubility (e.g., sugars, gelatin, pectin, acacia and other vegetable gums, etc). The specific ingredients that will be desired in any given case, and the amounts used, will be evident to those skilled in the art and need not therefore be discussed in detail. It should be perhaps emphasized however that it is the total amount of water-soluble filler(s) that may constitute as much as 95 (but generally not more than 70) Weight percent of the formulation; that is, that the formulation may contain zero to 95 (or 70) percent of an effervescing agent, zero to 95 (or 70) percent of a polymeric filler, etc., as well as mixtures thereof in any suitable proportion. Typically, the amount of water-insoluble ingredients will not exceed 10 weight percent of the formulation.

Finally, it will be understood that, while being especially advantageous for the production of solder-bearing articles, the method of the invention is not so limited. It can be utilized for the production of a removable, water-soluble coating or other deposit upon a substrate for virtually any purpose; e.g., to serve as a water-soluble adhesive, such as for the temporary tacking, bonding or mounting of a component, as a removable marking system, to provide temporary spacers, for potting, as a readily removable protective barrier layer, etc.

Thus, it can be seen that the present invention provides a novel formulation and method for producing a water-soluble deposit upon a substrate. The deposit can be readily, thoroughly and rapidly removed, using mild washing conditions and, if so desired, commercially available equipment, and the method is particularly adapted for the production of a solder-bearing article, especially a PCB. The formulation of the invention exhibits fast and complete cure and good adhesion to the underlying surface, and it may afford excellent resistance to deterioration, particularly in the chemical and thermal environment in which conventional soldering operations are carried out. It is in addition readily applied to a substrate, typically being formulated to have a viscosity of 8 to 12 poise (at 25° Centigrade) so as to make it especially well suited for application by automatic means in producing PCBs, and thereby to obviate much of the tedious and time-consuming manual work that often characterizes such manufacture; higher viscosity liquids, and paste-like formulations, are however also provided by the invention. Finally, the formulation and method hereof afford favorable economic attributes while also satisfying other criteria desired in a coating of the character described, and in a process for the application thereof.

Having thus described the invention, what is claimed is:

1. A formulation for producing a water-soluble deposit upon a substrate, comprising:
   a particulate agent that effervesces upon admixture with water; and
   a nonaqueous liquid substance that is curable to a solid, adherent, water-soluble matrix for said agent, said agent being dispersed in said substance.

2. The formulation of claim 1 containing at least four percent, based upon the weight of said formulation, of said agent.

3. The formulation of claim 1 wherein said agent is a mixture of a solid acid compound and a solid base compound, at least one of said compounds being insoluble in said substance.

4. The formulation of claim 3 wherein said acid compound is an organic acid and said base compound is an inorganic carbonate or bicarbonate compound.

5. The formulation of claim 4 wherein said organic acid is selected from the group consisting of citric, ascorbic and p-toluenesulfonic acids, and mixtures thereof.

6. The formulation of claim 3 wherein the acid compound:base compound weight ratio is 1:4 to 4:1.

7. The formulation of claim 1 wherein said liquid substance comprises a polymerizable monomer composition.

8. The formulation of claim 7 wherein the polymerizable monomer of said composition consists predominantly of at least one vinyl monomer.

9. The formulation of claim 8 wherein said at least one vinyl monomer is a cyclic vinyl amide compound.

10. The formulation of claim 9 wherein said vinyl amide compound is n-vinyl-2-pyrrolidone.

11. The formulation of claim 9 wherein said composition includes an aliphatic acrylamide compound.

12. The formulation of claim 11 wherein said acrylamide compound is N,N-dimethylacrylamide.

13. The formulation of claim 7 wherein said composition includes a water-soluble polymer.

14. The formulation of claim 13 wherein said polymer is polyvinylpyrrolidone.

15. The formulation of claim 7 wherein said composition includes an initiator for initiating polymerization of said polymerizable monomer.

16. The formulation of claim 15 wherein said initiator is a photoinitiator.

17. The formulation of claim 16 wherein said photoinitiator is responsive to radiation in the ultraviolet region of the spectrum.

18. The formulation of claim 1 additionally including a desiccant dispersed in said substance.

19. A formulation for producing a water-soluble deposit upon a substrate, including a nonaqueous liquid substance comprised of: a cyclic vinyl amide monomer, an aliphatic acrylamide monomer, a water-soluble filler, and a radiation-responsive photoinitiator for effecting polymerization of said monomers, said monomers being copolymerizable to produce a water-soluble copolymer.

20. The formulation of claim 19 wherein said cyclic vinyl amide monomer is n-vinyl-2-pyrrolidone, wherein said acrylamide monomer is N,N-dimethylacrylamide, and wherein said filler comprises polyvinYlpyrrolidone.

21. The formulation of claim 19 wherein said filler comprises at least four percent, based upon the weight of said formulation, of a particulate agent that effervesces upon admixture with water, said agent being dispersed in said liquid substance.

22. The formulation of claim 21 additionally including a desiccant dispersed in said substance.

23. The formulation of claim 19 additionally including an ingredient to increase the viscosity thereof.

24. In a method for producing an article, the steps comprising:
   (a) applying to the surface of a substrate a formulation comprising a particulate agent that effervesces upon admixture with water; and a nonaqueous liquid substance that is curable to a solid, adherent, water-soluble matrix for said agent, said agent being dispersed in said substance;
   (b) effecting curing of said applied formulation, to produce a solid deposit on said surface; and
   (c) washing said surface with water to effect removal of said deposit.

25. The method of claim 24 wherein said formulation contains at least four percent, based upon the weight of said formulation, of said agent.

26. The method of claim 24 wherein said agent is a mixture of solid acid compound and a solid base compound, at least one of said compounds being insoluble in said substance.

27. The method of claim 24 wherein said acid compound is an organic acid selected from the group consisting of citric, ascorbic and p-toluenesulfonic acids, and mixtures thereof, and wherein said base compound is an inorganic carbonate or bicarbonate compound.

28. The method of claim 24 wherein said liquid substance comprises a polymerizable monomer composition.

29. The method of claim 28 wherein said composition includes a water soluble polymer.

30. The method of claim 28 wherein said composition includes an initiator for initiating polymerization of said polymerizable monomer.

31. The method of claim 28 wherein said formulation includes a photoinitiator for initiating polymerization of said polymerizable monomer, said photoinitiator being responsive to radiation in the ultraviolet region of the spectrum; and wherein, in said step (b), said formulation is exposed to radiation in said region.

32. The method of claim 28 wherein the polymerizable monomer of said composition consists predominantly of at least one vinyl monomer, said at least one vinyl monomer being a cyclic vinyl amide compound.

33. The method of claim 32 wherein said composition includes an aliphatic acrylamide compound.

* * * * *